US012787652B2

(12) United States Patent
Yoshioka et al.

(10) Patent No.: US 12,787,652 B2
(45) Date of Patent: Nov. 3, 2026

(54) LIQUID EJECTION HEAD AND METHOD OF MANUFACTURING LIQUID EJECTION HEAD

(71) Applicant: CANON KABUSHIKI KAISHA, Tokyo (JP)

(72) Inventors: Toshifumi Yoshioka, Kanagawa (JP); Rei Kurashima, Kanagawa (JP); Takahiro Matsui, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 147 days.

(21) Appl. No.: 18/955,744

(22) Filed: Nov. 21, 2024

(65) Prior Publication Data

US 2025/0176436 A1 May 29, 2025

(30) Foreign Application Priority Data

Nov. 28, 2023 (JP) ................................ 2023-200660

(51) Int. Cl.
*B41J 2/14* (2006.01)
*B41J 2/16* (2006.01)
(Continued)

(52) U.S. Cl.
CPC ........ *H10N 30/872* (2023.02); *B41J 2/14233* (2013.01); *B41J 2/161* (2013.01);
(Continued)

(58) Field of Classification Search
CPC ...... B41J 2/14072; B41J 2/161; B41J 2/1623; B41J 2/1626; B41J 2/1642; B41J 2/16233;
(Continued)

(56) References Cited

U.S. PATENT DOCUMENTS

2009/0207213 A1* 8/2009 Tsuda ...................... B41J 2/055 347/70
2012/0229573 A1* 9/2012 Mizukami ............ B41J 2/14233 347/50
(Continued)

FOREIGN PATENT DOCUMENTS

JP 2009184247 A 8/2009
JP 2017132050 A 8/2017

*Primary Examiner* — Anh T Vo
(74) *Attorney, Agent, or Firm* — Canon U.S.A., Inc. IP Division

(57) ABSTRACT

A liquid ejection head includes an ejection element substrate having a substrate, a vibration plate provided at the substrate, a piezoelectric element having a first electrode, a piezoelectric layer, and a second electrode in this order on a surface of the vibration plate opposite from the substrate, a first wiring electrically connected to the first electrode, a second wiring electrically connected to the second electrode, and a pad electrode electrically connected to the first wiring and/or the second wiring. The liquid ejection head also includes an electric wiring board electrically connected to the pad electrode with a mounting electrode interposed in between. The pad electrode has higher hardness than the first wiring, and the second wiring and has a pad region bonded to the mounting electrode and a connection region bonded to the wiring electrically connected to the pad electrode.

20 Claims, 12 Drawing Sheets

(51) Int. Cl.
*H10N 30/063* (2023.01)
*H10N 30/87* (2023.01)

(52) U.S. Cl.
CPC ........... *B41J 2/1623* (2013.01); *B41J 2/1626* (2013.01); *H10N 30/063* (2023.02); *H10N 30/875* (2023.02); *H10N 30/877* (2023.02)

(58) Field of Classification Search
CPC ...... B41J 2/1631; B41J 2/1643; B41J 2/1645; B41J 2/16; B41J 2002/14241; B41J 2002/14491; H10N 30/06; H10N 30/063; H10N 30/872; H10N 30/875; H10N 30/877
See application file for complete search history.

(56) References Cited

U.S. PATENT DOCUMENTS

| | | | | |
|---|---|---|---|---|
| 2012/0236083 | A1* | 9/2012 | Mizukami | B41J 2/1612<br>347/70 |
| 2014/0176646 | A1* | 6/2014 | Hirai | B41J 2/1645<br>29/25.35 |
| 2014/0267510 | A1* | 9/2014 | Furuya | B41J 2/14201<br>310/317 |

* cited by examiner

LIQUID EJECTION HEAD AND METHOD OF MANUFACTURING LIQUID EJECTION HEAD

BACKGROUND

Field

The present disclosure relates to a liquid ejection head and a method of manufacturing the liquid ejection head.

Description of the Related Art

As a liquid ejection head that performs printing by ejecting liquid to a print medium, one is known in which, for example, part of a pressure chamber communicating with a nozzle that jets an ink droplet is formed with a vibration plate. By being deformed by a piezoelectric element, this vibration plate allows pressure to be applied to the ink in the pressure chamber and an ink droplet to be ejected from the nozzle. The piezoelectric element of such a liquid ejection head includes a piezoelectric membrane, which is a membrane-shaped piezoelectric element, and electrodes formed to sandwich the piezoelectric membrane from above and below (also referred to as an upper electrode and a lower electrode). By driving the piezoelectric membrane through application of voltage by the upper and lower electrodes, the piezoelectric element deforms the vibration plate and causes a droplet (an ink droplet) to be ejected from the nozzle. In this event, a voltage necessary for the piezoelectric membrane to be displaced sufficiently is several tens of volts. In a case where the piezoelectric film is formed using a semiconductor, a relatively high voltage for a semiconductor device needs to be applied.

Also, a liquid ejection head has a fine design in order to be able to print a high-resolution image, and a plurality of piezoelectric elements are arranged at high density. In recent years, the pitch between nozzles for the piezoelectric elements in their arrangement direction has been becoming narrower and therefore higher in density, such as 600 nozzles per inch (npi), 1200 npi, or 2400 npi. As the piezoelectric elements are thus arranged at high density, lead wirings electrically connected to the piezoelectric elements and pad electrodes for giving electrical signals (drive signals) to the piezoelectric elements from the outside are arranged at high density as well. Flexible boards or the like are mounted on the pad electrodes in order to be connected to an external driving circuit and give electric signals to the piezoelectric elements. One method for mounting the flexible boards is one that uses wire bonding. Other methods for mounting the flexible boards include one that uses an anisotropic conductive film (ACF) or an anisotropic conductive paste (AFP) and one that uses a non-conductive film (NCF) or a non-conductive paste (NCP). Note that the method using an ACF or ACP is also referred to as an anisotropic conductive film/paste (ACF/ACP), and the method using an NCF or NCP is also referred to as a non-conductive film/paste (NCF/NCP).

In a case where the pitch between adjacent ones of a plurality of pad electrodes is approximately 50 μm or smaller, it is difficult to employ a mounting method that uses wire bonding because of the size of fast bond. In a case of the mounting method that uses wire bonding, a possible measure to take is to arrange the pad electrodes in a staggered arrangement, but this increases the possibility of shorting between adjacent pad electrodes (bonding wires). Also, as described earlier, a relatively high voltage is necessary to deform the piezoelectric membranes sufficiently, and this relatively high voltage is exerted to the pad electrode as well. For this reason, in a case of ACF/ACP, which has conductive particles present in an adhesive, leak current or the like may occur. For these reasons, in a case where the pitch between adjacent pad electrodes is approximately 50 μm or smaller, NCF/NCP is often used from the perspective of reliability. For example, Japanese Patent Laid-Open No. 2017-132050 discloses using NCF/NCP for mounting in a case where drive contacts (pad electrodes) of piezoelectric elements are arranged at a fine pitch.

Also, in manufacturing of a liquid ejection head, electrical inspection, aging, screening, and the like are conducted on piezoelectric elements to ensure reliability of the liquid ejection head. For example, Japanese Patent Laid-Open No. 2009-184247 discloses conducting aging and screening of piezoelectric elements after forming pressure chambers. Note that in aging of piezoelectric elements, an electric signal (also referred to as a drive signal) at a higher voltage and a higher frequency than the one applied in actual usage is applied to the piezoelectric membranes. Also, in aging of the piezoelectric elements, the piezoelectric elements may be heated. This polarizes the piezoelectric membranes and mitigates the internal stress in various thin films constituting the piezoelectric elements, so as to reduce fluctuations of the piezoelectric elements that occur over time under the actual usage conditions. In screening of piezoelectric elements, the piezoelectric membranes are driven under conditions stricter than those for aging to eliminate non-compliant piezoelectric elements. In the event of conducting electric inspection or the like in the midst of a process of manufacturing the liquid ejection head, an electric signal is applied to the piezoelectric element by probing, where a probe for applying an electric signal is brought into contact with a pad electrode connected to a lead wiring.

SUMMARY

A material with a low electrical resistivity (e.g., gold (Au), aluminum (Al), or copper (Cu)) is often used for the lead wirings and the pad electrodes. Many of the above-described materials with a low electrical resistivity are relatively soft materials, and their Vickers hardnesses are approximately 20 HV to 30 HV. Thus, the pad electrode may be physically damaged (e.g., scraped) by the probing, and unevenness having a height difference of 1 μm or greater, i.e., a probe mark, may be formed at the pad electrode. In a case where a flexible board is mounted at a pad electrode where a probe mark is formed, the unevenness of the probe mark can cause a connection failure.

A liquid ejection head according to an aspect of the present disclosure includes: an ejection element substrate having a substrate where a pressure chamber is formed, the pressure chamber communicating with an ejection port from which a droplet is ejected, a vibration plate provided on one surface side of the substrate, a piezoelectric element having a first electrode, a piezoelectric layer, and a second electrode in this order on a surface of the vibration plate opposite from the substrate, a first wiring electrically connected to the first electrode, a second wiring electrically connected to the second electrode, and a pad electrode electrically connected to at least one of the first wiring and the second wiring, the pad electrode including a layer formed of a same material as the first electrode; and an electric wiring board electrically connected to the pad electrode with a mounting electrode interposed in between. The pad electrode has a higher hardness than the first wiring and the second wiring, and the pad electrode has a pad region to which the mounting electrode is bonded and a connection region to which the wiring electrically connected to the pad electrode is bonded.

Further features of the present disclosure will become apparent from the following description of exemplary embodiments with reference to the attached drawings.

DESCRIPTION OF THE EMBODIMENTS

A preferred embodiment of the present disclosure is described in detail below with reference to the drawings attached hereto. Note that the embodiment below does not limit the matters of the present disclosure and that not all the combinations of features described in the embodiment below are necessarily essential as solutions provided by the present disclosure. Note that the same configurations are described using the same reference number.

Comparative Example

Figure 11A:
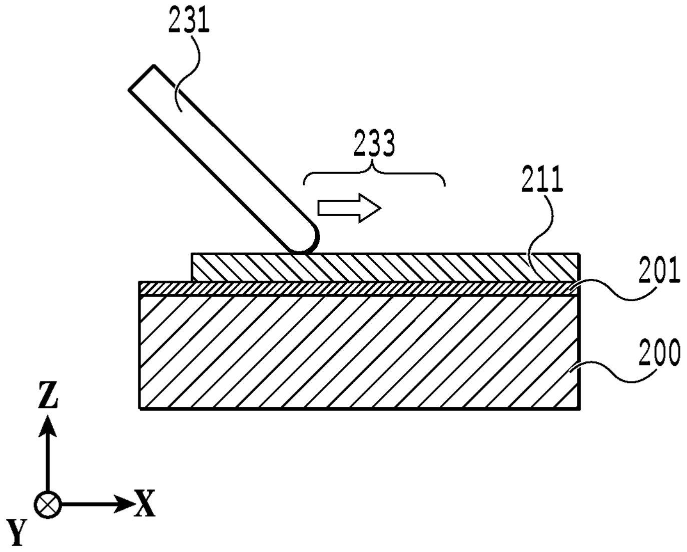
FIGS. 11A and 11B are schematic sectional views showing a comparative example of electrical inspection.
Figure 11B:
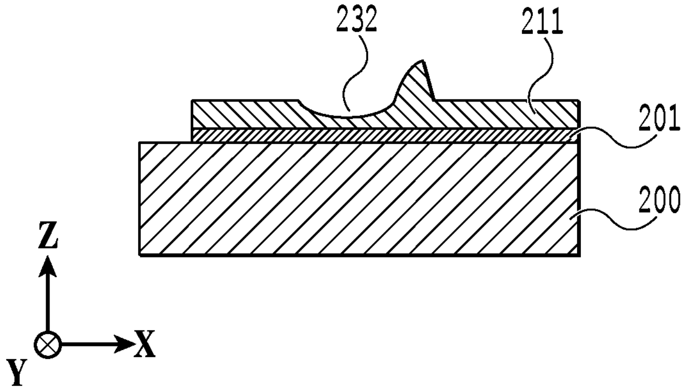

FIGS. 11A and 11B are schematic sectional diagrams showing a comparative example of electric inspection. FIG. 11A is a schematic sectional diagram showing a comparative example of electric inspection using a probe 231. FIG. 11B is a schematic sectional diagram showing how a probe mark 232 is generated by electrical inspection. In the comparative example shown in FIGS. 11A and 11B, a pad electrode 211 having a typical aluminum electrode layer is formed on the upper surface side of a substrate 200 with an insulating layer 201 interposed in between. Note that the substrate 200 is formed using silicon (Si) or the like. As shown in FIG. 11A, in probing, the probe 231 is brought into contact with the pad electrode 211 and is scanned in the direction of an arrow (a +X-direction in FIG. 11A). The distance by which the probe 231 is scanned is referred to as an overdrive amount. The area with which the probe 231 comes into contact is referred to as a probing region 233.

As shown in FIG. 11B, in the probing region 233, the pad electrode 211 may be scraped and deformed, and as a result, large unevenness, i.e., the probe mark 232, may be formed where the residue of the scraping is a projection. In a case where a flexible board (not shown) is mounted on the pad electrode 211 where the probe mark 232 is formed, the unevenness of the probe mark 232 may cause a connection failure. Also, in a case where a mounting electrode is formed at the pad electrode 211 using gold plating or the like in order to improve the reliability of connection to an electrode of the flexible board, the flexible board is mounted on the pad electrode 211 with the mounting electrode of the pad electrode 211 and the electrode of the flexible board being brought into contact with each other. In a case where the mounting electrode is formed using gold plating or the like, the probe mark 232 may cause the mounting electrode to grow abnormally, and unevenness may be formed at the mounting electrode as well. In a case of using NCF/NCP to mount a flexible board onto the pad electrode 211, the unevenness formed at the mounting electrode makes it easier for the NCF or NCP to enter between the mounting electrode of the pad electrode 211 and the electrode of the flexible board. This may make occurrence of a connection failure more likely.

In the present embodiment, a configuration is described where the pad electrode is increased in hardness to provide a liquid ejection head with high electric reliability.

Embodiment

<Configuration of the Liquid Ejection Head>

Figure 12:
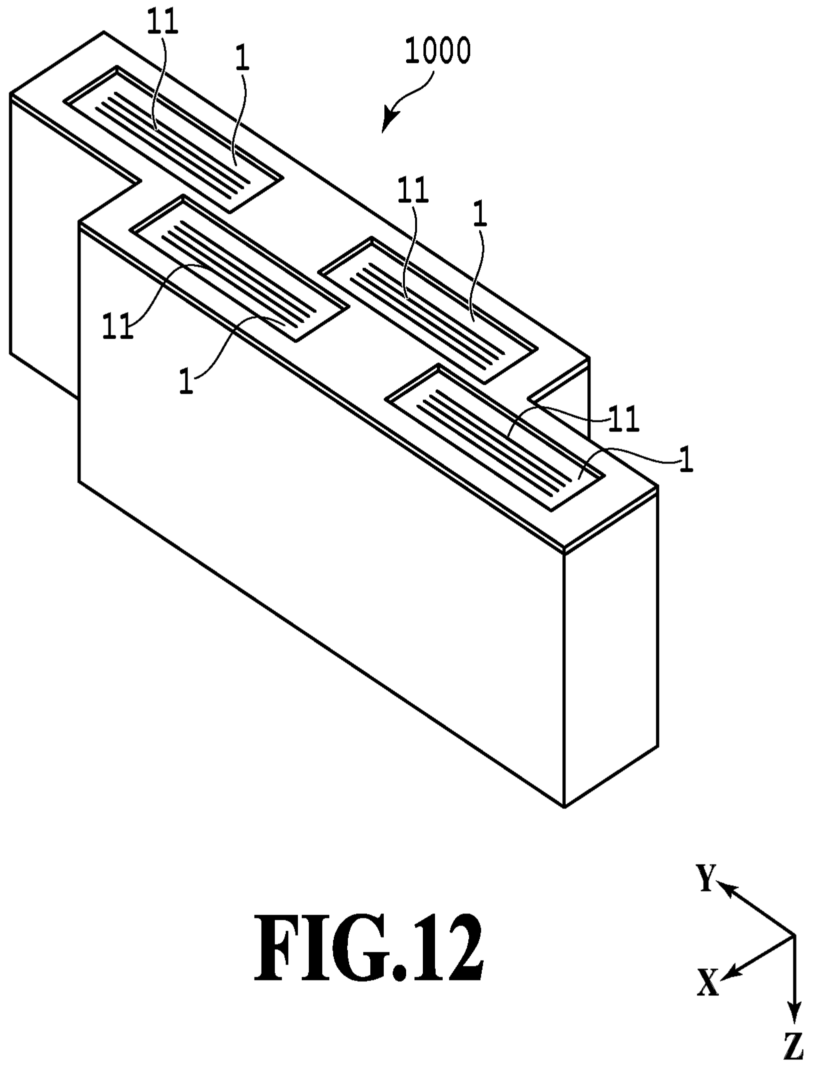
FIG. 12 is a diagram showing a liquid ejection head.

As shown in FIG. 12, the liquid ejection head 1000 is formed by an array of a plurality of element substrates 1 having a plurality of ejection elements and an array of a plurality of ejection ports 11. Each element substrate 1 is typically connected to a flexible board 160 (see FIG. 3 to be referred to later) and is further connected to an electric wiring board (not shown). The electric wiring board has a power supply terminal for supplying power and a signal input terminal for receiving a drive signal. Meanwhile, circulation flow channels (not shown) are formed in an ink supply unit (not shown) to supply each element substrate 1 with ink containing a color material and supplied from an ink tank (not shown) and to collect ink not consumed in printing.

With the above-described configuration, based on print data inputted from the signal input terminal, each of the ejection elements disposed at the element substrate 1 ejects the ink supplied from the ink supply unit from the ejection port in the −Z-direction using the power supplied from the power supply terminal. Note that the dimensional values of each part described above are merely examples and may be changed as needed according to required specifications. Also, although ink is ejected as an example of liquid here, the present disclosure is not limited to this, and for example, a primer may be ejected as the liquid.

<Flow channel Configuration of the Liquid Ejection Head>

Figure 1A:
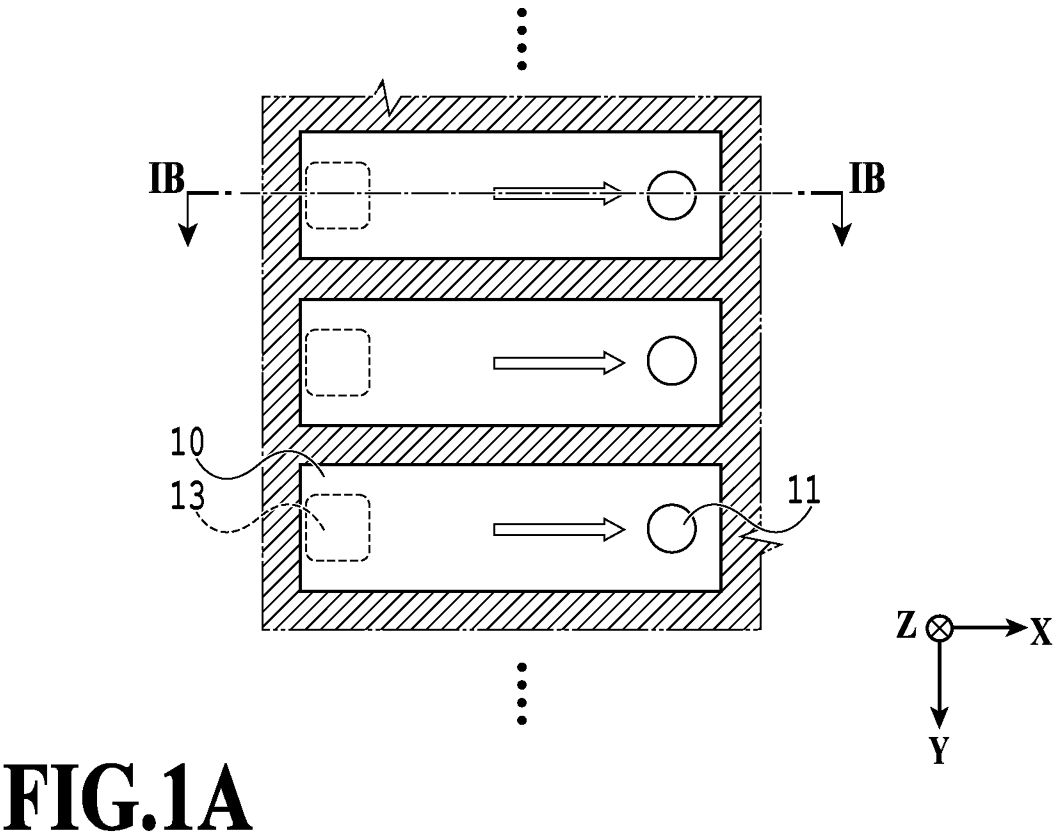
FIGS. 1A and 1B are schematic diagrams showing a flow channel configuration of a liquid ejection head.
Figure 1B:
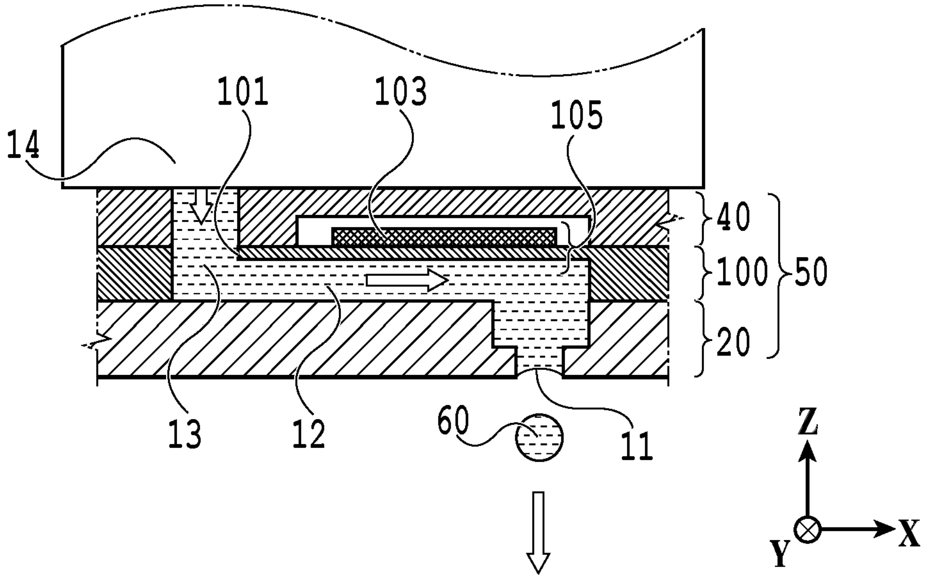

FIGS. 1A and 1B are schematic diagrams showing the flow channel configuration of an element substrate 50 included in the element substrate 1 of the liquid ejection head 1000 of the present embodiment. FIG. 1A is a sectional view of the element substrate 50 seen from an ejection port 11 side of a flow channel block 10. FIG. 1B is a sectional view taken along IB-IB in FIG. 1A. The element substrate (ejection element substrate) 50 includes three substrates (a first flow channel substrate 20, a second flow channel substrate 100, and a third flow channel substrate 40), and flow channels are formed by combination of these substrates. As shown in FIG. 1A, the flow channel block 10 includes ejection ports 11 arrayed in the Y-direction as well as pressure chambers 12 and supply flow channels 13 prepared to communicate with the respective ejection ports 11. Each of the supply flow channels 13 is connected to a common liquid chamber 14 and supplies a liquid (hereinafter also referred to as ink) to the corresponding pressure chamber 12. The arrow in FIG. 1 shows the flow of the liquid (ink).

As shown in FIG. 1B, the element substrate 50 in the present embodiment is configured such that the first flow channel substrate 20, the second flow channel substrate 100, and the third flow channel substrate 40 are laminated in the Z-direction. The first flow channel substrate 20 is a substrate including the ejection ports 11 for ejecting ink. The second flow channel substrate 100 is a substrate where piezoelectric elements 105 and the pressure chambers 12 are formed. The third flow channel substrate 40 is a substrate that isolates a piezoelectric membrane 103 of the piezoelectric element 105 from ink and is also a substrate including flow channels through which ink is supplied from the common liquid chamber 14 to the pressure chambers 12. Note that the first flow channel substrate 20, the second flow channel substrate 100, and the third flow channel substrate 40 are formed using silicon (Si) or the like.

The supply flow channel 13, the pressure chamber 12, and the ejection port 11 are formed in correspondence to each piezoelectric element 105. Adjacent pressure chambers 12 are partitioned from each other by a partitioning wall and are not directly affected by their adjacent piezoelectric elements 105. The piezoelectric element 105 is formed adjacent to an insulating film 101 serving as a vibration plate.

In a stable state, ink housed in the pressure chamber 12 forms a meniscus at the ejection port 11. In the event where a voltage waveform is applied to the piezoelectric element 105 in accordance with a drive signal, the piezoelectric element 105 deforms, allowing the pressure chamber 12 to expand or contract via the insulating film 101. By combining an expansion operation and a contraction operation, a droplet (ink droplet) 60 is generated from the meniscus and ejected in the −Z-direction.

After the ink in the pressure chamber 12 is consumed by the ejection operation, ink is supplied from the common liquid chamber 14 due to capillary action of the ejection port 11 and forms a meniscus again at the ejection port 11. Note that in the present embodiment, the ejection port 11, the piezoelectric element 105, and the pressure chamber 12 are together referred to as an ejection element.

In the present embodiment, the ejection port 11 may be 25 μm in diameter and 30 μm in thickness, and the first flow channel substrate 20 may be 100 μm in thickness. Also, the viscosity of ink used may be 4 cp, and a minimum ink ejection amount from each ejection port 11 may be 3 pl.

In the present embodiment, a drive frequency for each piezoelectric element 105 may be 30 kHz. Such a drive frequency can be set appropriately based on the time it requires for each ejection element to be refilled with new ink and be ready for the next ejection operation after actually ejecting ink upon application of a voltage to the piezoelectric element 105.

<Configuration of the Element Substrate>

Figure 2A:
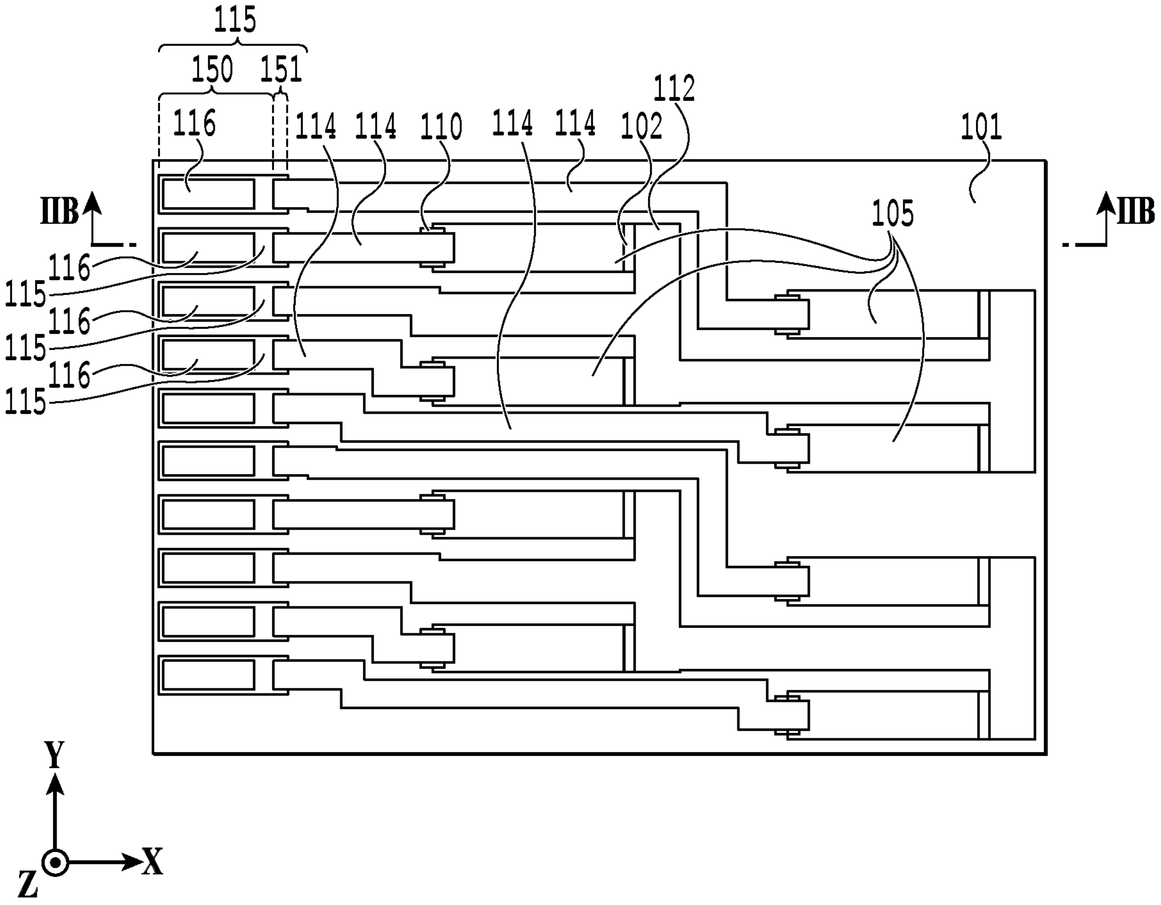
FIGS. 2A and 2B are schematic diagrams illustrating the liquid ejection head.
Figure 2B:
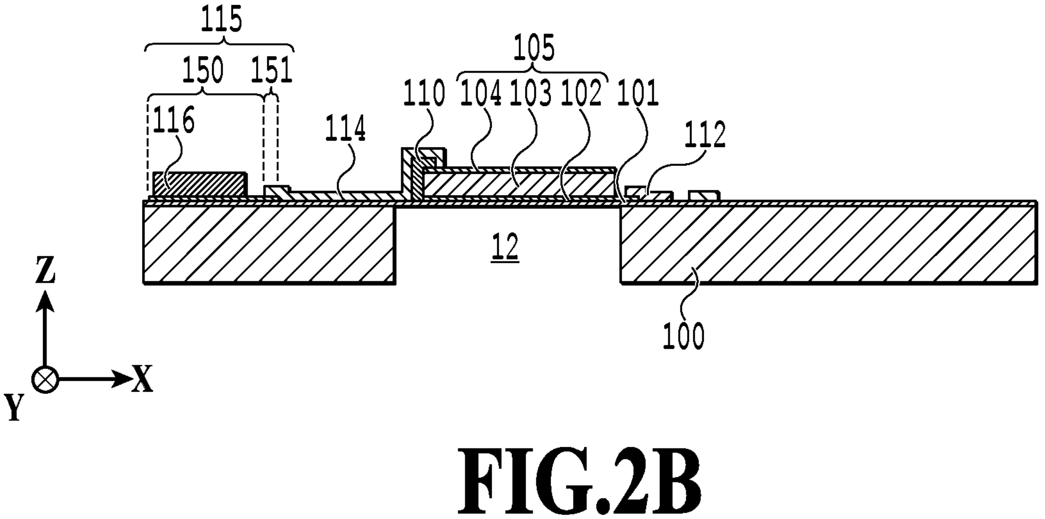

FIGS. 2A and 2B are schematic diagrams illustrating the liquid ejection head of the present embodiment. FIG. 2A is a plan view schematically showing the liquid ejection head. FIG. 2B is a sectional view taken along IIB-IIB in FIG. 2A. In order to make it easier to understand the arrangement of the piezoelectric elements 105, wirings, and the like, FIGS. 2A and 2B only show the second flow channel substrate 100 of the element substrate 50 in a simplified manner, omitting the ejection ports 11 and the supply flow channels 13 depicted in FIGS. 1A and 1B.

As shown in FIGS. 2A and 2B, the liquid ejection head of the present embodiment includes the second flow channel substrate 100, the insulating film 101, and a plurality of piezoelectric elements 105. The liquid ejection head of the present embodiment further includes first wirings 112, second wirings 114, pad electrodes 115, and mounting electrodes 116. As shown in FIG. 2B, the insulating film 101 to serve as a vibration plate is formed on the upper surface side (one surface side) of the second flow channel substrate 100. For the insulating film 101, for example, a typical insulating material such as a silicon oxide film, a silicon nitride film, a silicon oxynitride film, or an aluminum oxide film is used. Also, the insulating film 101 may be a multilayer film having a lamination of at least two of a silicon oxide film, a silicon nitride film, a silicon oxynitride film, and an aluminum oxide film.

A first electrode 102, the piezoelectric membrane 103, and a second electrode 104 are disposed in this order on the upper surface of the insulating film 101, and the first electrode 102, the piezoelectric membrane 103, and the second electrode 104 form each piezoelectric element 105. Note that at portions of the second flow channel substrate 100 which are located on the opposite side from the piezoelectric elements 105, a plurality of pressure chambers 12 are formed in correspondence to the plurality of piezoelectric elements 105. At surfaces of the pressure chambers 12 located on the opposite side from the piezoelectric elements 105, a plurality of ejection ports 11 in the first flow channel substrate 20 (not shown in FIG. 2A or 2B) are disposed in correspondence to the plurality of pressure chambers 12. The pressure chambers 12 and the ejection ports 11 thus communicate with each other.

The first electrodes 102 are formed at the upper surface of the insulating film 101, or in other words, a surface of the insulating film 101 opposite from the second flow channel substrate 100. A material for the first electrode 102 may be platinum (Pt) or iridium (Ir). A material for the first electrode 102 may also be a platinum alloy or an iridium alloy. The first electrode 102 serves also as a film for controlling the alignment of the crystalline orientation of the piezoelectric membrane 103. In a case where a material for the piezoelectric membrane 103 is lead zirconate titanate, a material for the first electrode 102 is preferably platinum, iridium, a platinum alloy, or an iridium alloy. Note that a film for controlling the alignment of the crystalline orientation of the piezoelectric membrane 103 is also referred to as a crystalline orientation control film. Also, as an adhesion layer for ensuring the strength of adhesion between the insulating film 101 and the first electrodes 102, a thin film (not shown) of titanium (Ti), chromium (Cr), or the like may be formed between the insulating film 101 and the first electrodes 102.

The piezoelectric membrane 103 is formed on the upper surface of the first electrode 102, or in other words, a surface of the first electrode 102 opposite from the insulating film 101. A well-known material for the piezoelectric membrane 103 is a lead zirconate titanate ceramic. The piezoelectric membrane 103, which is a membrane-shaped piezoelectric layer, can be formed by vacuum sputtering film formation, film formation using a sol-gel solution, CVD film formation, or the like. The thickness of the piezoelectric membrane 103 is determined by a voltage to be applied and piezoelectric characteristics necessary for attaining a desired displacement. For example, the thickness of the piezoelectric membrane 103 may be approximately 1 μm to 2 μm.

The second electrode 104 is formed on the upper side of the piezoelectric membrane 103, or in other words, on a surface of the piezoelectric membrane 103 opposite from the first electrode 102. A material for the second electrode 104 may be platinum, titanium, or tungsten (W). A material for the second electrode 104 may also be a platinum alloy, a titanium alloy, or a tungsten alloy. In this way, a material for the second electrode 104 is preferably platinum, titanium, tungsten, a platinum alloy, a titanium alloy, or a tungsten alloy. Note that a titanium alloy is often used as a material for the second electrode 104. Also, as an adhesion layer for ensuring the strength of adhesion between the second electrode 104 and the piezoelectric membrane 103, a thin film (not shown) of titanium, chromium, or the like may be formed between the second electrode 104 and the piezoelectric membrane 103.

As shown in FIG. 2A, the plurality of piezoelectric elements 105 are arranged at high density in order to print a high-resolution image. In order to provide an easy-to-understand illustration of the present embodiment, FIG. 2A shows an example where the piezoelectric elements 105 are arranged in two arrays in a staggered arrangement in a planar manner. The piezoelectric elements 105 may be arranged in four arrays or eight arrays, or the liquid ejection head may have the piezoelectric elements 105 that are arranged at even higher density.

As shown in FIG. 2A, the first wirings 112 electrically connected to the first electrodes 102 are led to a −X-direction end portion of the upper surface of the insulating film 101. Meanwhile, the second wirings 114 electrically connected to the second electrodes 104 are led to a −X-direction end portion of the upper surface of the insulating film 101, extending over insulating layers 110. Note that the first wirings 112 and the second wirings 114 are also referred to lead wirings. The first wirings 112 are each a common wiring led from a plurality of (e.g., four) piezoelectric elements 105 (the first electrodes 102). The first wiring 112 functions as a common electrode that applies a common electric signal to the plurality of piezoelectric elements 105. The second wirings 114 are each an individual wiring led from an individual piezoelectric element 105 (the second electrode 104). The second wirings 114 function as individual electrodes that apply electric signals to the individual piezoelectric elements 105. Typical metal materials can be used for the first wirings 112 and the second wirings 114. To reduce influences caused by wiring resistance, such as signal delay and voltage drop, a metal with a relatively low electrical resistivity is used for the first wirings 112 and the second wirings 114. For example, a material for the first wirings 112 and the second wirings 114 may be gold, aluminum, or copper. Also, a material for the first wirings 112 and the second wirings 114 may be a gold alloy, an aluminum alloy, or a copper alloy. In this way, a material for the first wirings 112 and the second wirings 114 is preferably gold, aluminum, copper, a gold alloy, an aluminum alloy, or a copper alloy. Also, as an adhesion layer for improving the adhesion of the first wirings 112 and the second wirings 114, a thin film (not shown) of titanium, chromium, or the like may be formed at the lower surfaces of the first wirings 112 and the second wirings 114.

The insulating layer 110 is formed at a −X-direction side portion of the piezoelectric element 105. For the insulating layer 110, for example, a typical insulating material such as a silicon oxide film, a silicon nitride film, a silicon oxynitride film, or an aluminum oxide film is used. Also, the insulating layer 110 may be a multilayer film having a lamination of at least two of a silicon oxide film, a silicon nitride film, a silicon oxynitride film, and an aluminum oxide film. Note that for reasons of convenience in manufacturing of the liquid ejection head, protection of the members of the liquid ejection head, and the like, an insulating layer may be formed between the first wiring 112 and the first electrode 102 and between the second wiring 114 and the second electrode 104. In this case, the first wiring 112 and the first electrode 102 may be bonded to each other via a contact hole formed in and penetrating through the insulating layer between the first wiring 112 and the first electrode 102, and the second wiring 114 and the second electrode 104 may be bonded to each other via a contact hole formed in and penetrating through the insulating layer between the second wiring 114 and the second electrode 104. Also, a protective insulating layer may be formed covering the upper surface side of the first wirings 112 or the second wirings 114. The insulating layers with contact holes formed therethrough and the protective insulating layer are not depicted to provide an easy-to-understand illustration of the present embodiment.

Each pad electrode 115 for giving an external electric signal is electrically connected to either the first wiring 112 or the second wiring 114. Note that the pad electrodes 115 electrically connected to the first wirings 112 may be referred to as first pad electrodes, and the pad electrodes 115 electrically connected to the second wirings 114 may be referred to as second pad electrodes. The plurality of pad electrodes 115 are arrayed side by side on the upper surface of the insulating film 101 at a region different from the region with the piezoelectric elements 105, or specifically, a region along a peripheral portion of one side (the −X-direction side) of the second flow channel substrate 100. The direction in which the pad electrodes 115 are arrayed is a direction along the peripheral portion of one side (the −X-direction side) of the second flow channel substrate 100 extending in the Y-direction (and is therefore the Y-direction). Although the pad electrodes 115 are arrayed only at one side of the second flow channel substrate 100 (the insulating film 101) in FIGS. 2A and 2B, the present disclosure is not limited to this. For example, the pad electrodes 115 may be divided and arrayed on both sides (the −X-direction side and the +X-direction side) of the second flow channel substrate 100. Note that in a case where the pad electrodes 115 are arrayed at one side of the second flow channel substrate 100 (the insulating film 101), the pad electrodes 115 are aggregated at one side of the second flow channel substrate 100, which enables size reduction of the chip-shaped liquid ejection head (the element substrate 50). Also, because the pad electrodes 115 are aggregated at one side of the second flow channel substrate 100, the number of flexible boards mounted on the mounting electrodes 116 can be reduced, which enables reduction in the number of man-hours for mounting the flexible boards onto the mounting electrodes 116. Thus, the manufacturing cost for the liquid ejection head can be reduced.

The pad electrodes 115 are formed from the same layer as the first electrodes 102. Thus, similar to the first electrode 102, a material for the pad electrode 115 is preferably platinum, iridium, a platinum alloy, or an iridium alloy. Also, similar to the first electrode 102, as an adhesion layer for ensuring the strength of adhesion between the insulating film 101 and the pad electrodes 115, a thin film (not shown) of titanium, chromium, or the like may be formed between the insulating film 101 and the pad electrodes 115. Note that being formed from the same layer as the first electrode 102 means being formed from a layer which is a raw material for the first electrode 102, or specifically, a first electrode layer 102E (see FIGS. 4B and 4C) to be described layer.

Also, the pad electrodes 115 are each formed in such a manner as to extend longer in the X-direction than in the Y-direction. Each pad electrode 115 has a pad region 150 and a connection region 151 that are arranged side by side in the X-direction. The pad region 150 is formed on the −X-direction side of the pad electrode 115. The mounting electrode 116 for giving an external electrical signal to the piezoelectric element 105 is bonded to the upper surface of the pad region 150. The connection region 151 is formed on the +X-direction side of the pad electrode 115. The −X-direction end portion of the first wiring 112 or the second wiring 114 is bonded to the upper surface of the connection region 151.

It is preferable that in a direction (the X-direction) intersecting with the array direction of the pad electrodes 115, the ratio of the length of the connection region 151 to the length of the pad electrode 115 is 0.2 or below (20% or lower). This makes the pad region 150 relatively long and allows the pad electrode 115 to have enough room for a region where the probe comes into contact (a probing region).

Also, it is preferable that in the direction (the X-direction) intersecting with the array direction of the pad electrodes 115, the ratio of the length of the mounting electrode 116 to the length of the pad electrode 115 is 0.5 or greater (50% or higher). This enables the area of the mounting electrode 116 to be sufficient, and hence, electrical connection to the mounting electrodes 116 (mounting of flexible boards) can be established reliably even in a case where the array pitch of the pad electrodes 115 is narrow.

The mounting electrode 116 is formed at the upper surface of the pad region 150, extending longer in the X-direction than in the Y-direction. A typically used metal material can be used for the mounting electrodes 116. For example, a material for the mounting electrodes 116 may be gold, aluminum, or copper. A material for the mounting electrodes 116 may also be a gold alloy, an aluminum alloy, or a copper alloy. In this way, a material for the mounting electrodes 116 is preferably gold, aluminum, copper, a gold alloy, an aluminum alloy, or a copper alloy. Also, as an adhesion layer for improving the adhesion between the mounting electrode 116 and the pad region 150, a thin film (not shown) of titanium, chromium, or the like may be formed between the mounting electrode 116 and the pad region 150. Also, a flexible board is mounted on each mounting electrode 116. The material for the mounting electrode 116 is selected considering a material for the electrode of the flexible board to be mounted onto the mounting electrode 116, a method for mounting the flexible board, and the like. In a case where NCF/NCP is used as a method for mounting the flexible boards, it is preferable that the mounting electrodes 116 be formed by gold plating or the like and bonded to the pad regions 150.

In the liquid ejection head, the piezoelectric elements 105 are each driven by the individual wiring (the second wiring 114) that gives an individual signal to the piezoelectric element 105 and the common wiring (the first wiring 112) that gives a common signal to a plurality of piezoelectric elements 105. Also, in a case where there are a large number of piezoelectric elements 105, a single common wiring is disposed for some piezoelectric elements 105 due to problems in terms of, e.g., a region where the wirings leads are disposed and wiring resistance. For example, in a case where the piezoelectric elements 105 are arranged in two arrays as shown in FIG. 2A, a single common wiring is disposed for four piezoelectric elements 105. Also, in a case where the piezoelectric elements 105 are arranged in four arrays, a single common wiring may be disposed for eight piezoelectric elements 105. In a case where the piezoelectric elements 105 are disposed in eight arrays, a single common wiring may be arranged for sixteen piezoelectric elements 105. Thus, the number of first wirings 112 and second wirings 114 is larger than the number of piezoelectric elements 105, and so is the number of pad electrodes 115 corresponding to the first wirings 112 and the second wirings 114. As an example, a case is described where the piezoelectric elements 105 are disposed at 600 npi and a single common wiring is disposed for eight piezoelectric elements 105. In this case, with the pad electrodes 115 connected to the common wirings (the first wirings 112) and the pad electrodes 115 connected to the individual wirings (the second wirings 114) being arrayed side by side in one array, an array pitch of the pad electrodes 115 is approximately 50 μm or 50 μm or below. In a case where the array pitch of the pad electrodes 115 is approximately 50 μm or below, as described earlier, NCF/NCP is often used as a method for mounting the flexible boards.

In the present embodiment, electrical inspection of the piezoelectric elements 105 is conducted before the mounting electrodes 116 are formed. In the step of conducting electrical inspection, a probe for applying an electrical signal is brought into contact with the pad region 150 of the pad electrode 115 to conduct electrical inspection, aging, screening, and the like on the piezoelectric element 105. After the step of conducting electrical inspection, the mounting electrodes 116 are formed on the pad regions 150 of the pad electrodes 115.

As described earlier, in the step of conducting electrical inspection, the probe is brought to the pad region 150 where there is no first wiring 112 or second wiring 114. The material for the first wirings 112 and the second wirings 114 (such as gold, aluminum, or copper) is a soft metal material with a relatively low electrical resistivity. For example, gold has an electrical resistivity of $2.44\times10^{-8}\Omega\cdot m$ and a Vickers hardness of approximately 22 HV. Aluminum has an electrical resistivity of $2.65\times10^{-8}\Omega\cdot m$ and a Vickers hardness of approximately 25 HV, and copper has an electrical resistivity of $1.68\times10^{-8}\Omega\cdot m$ and a Vickers hardness of approximately 38 HV.

Meanwhile, the pad electrodes 115 are formed from the same layer as the first electrodes 102. Thus, a material for the pad electrodes 115 (such as platinum or iridium) has a relatively high electrical resistivity and is a hard material having a Vickers hardness of 45 HV or greater. For example, platinum has an electrical resistivity of $1.06\times10^{-7}\Omega\cdot m$ and a Vickers hardness of approximately 50 HV. Iridium has an electrical resistivity of $5.20\times10^{-8}\Omega\cdot m$ and a Vickers hardness of approximately 180 HV.

Tungsten, which is typically used as a material for a probe, is a metal harder than the metal for the pad electrodes 115 (such as platinum or iridium). Tungsten has a Vickers hardness of approximately 350 HV. During probing, the probe comes into contact with the pad region 150 of the pad electrode 115, sliding against the surface of the pad region 150. Thus, the pad electrode 115 does not need to be as hard as the probe. In a case where the pad electrode 115 is a flat thin film with a Vickers hardness of approximately 45 HV or greater, physical damage of the pad electrode 115 caused by probing, i.e., a probing mark, can be reduced.

Thus, electrical inspection, aging, screening, and the like can be conducted on the piezoelectric elements 105 without generating a probe mark on the pad electrodes 115. Then, after the step of conducting electrical inspection, the mounting electrodes 116 for external connection are formed on the pad regions 150 of the flat pad electrodes 115 absent of any probe marks. Thus, the mounting electrodes 116 formed are uniform and have flat surfaces.

Figure 3:
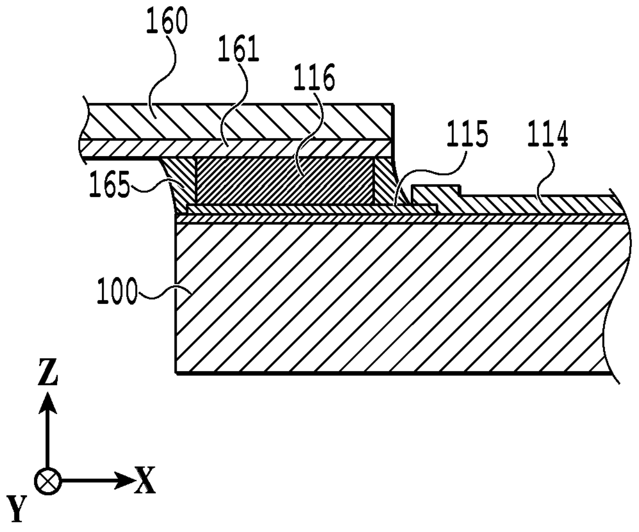
FIG. 3 is a schematic diagram showing a state where a flexible board is mounted on a mounting electrode.

FIG. 3 is a schematic diagram showing a state where the flexible board 160 is mounted on the mounting electrode 116. In the example shown in FIG. 3, NCF/NCP is used as a method for mounting the flexible board 160. The flexible board 160 is mounted on the mounting electrode 116 using a non-conductive adhesive 165 which is NCF or NCP. In mounting of the flexible board 160 on the mounting electrode 116, an electrode 161 of the flexible board 160 can be brought into contact with the flat uniform surface of the mounting electrode 116, which helps prevent occurrence of a connection failure caused upon mounting of the flexible board 160.

<Method of Manufacturing the Liquid Ejection Head>

Next, a method of manufacturing the liquid ejection head is described using FIGS. 4A to 6B. FIGS. 4A to 6B are step-by-step sectional diagrams illustrating the steps of manufacturing the liquid ejection head.

Figure 4A:
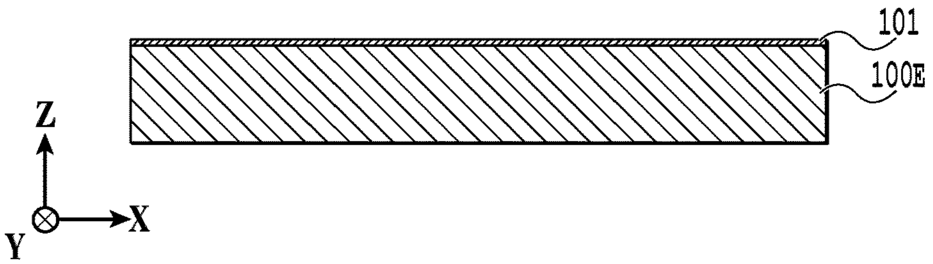
FIGS. 4A to 4D are step-by-step sectional views illustrating steps of manufacturing the liquid ejection head.

As shown in FIG. 4A, a substrate 100E made of single-crystal silicon is prepared as a raw material for the second flow channel substrate 100. The substrate 100E as a raw material for the second flow channel substrate 100 is hereinafter referred to simply as a substrate 100E. A thermally oxidized silicon film is formed on the upper surface (one of the surfaces) of the substrate 100E by a wet oxidization method using oxygen and a hydrogen gas. The insulating film 101 is thus formed.

Also, a layer as a raw material for the first electrodes 102 and the pad electrodes 115 is referred to as the first electrode layer 102E. A layer as a raw material for the piezoelectric membranes 103 is referred to as a piezoelectric membrane layer 103E. A layer as a raw material for the second electrodes 104 is referred to as a second electrode layer 104E. A film as a raw material for the insulating layers 110 is referred to as a material film 110E. A layer as a raw material for the first wirings 112 and the second wirings 114 is referred to as a wiring layer 114E.

Figure 4B:
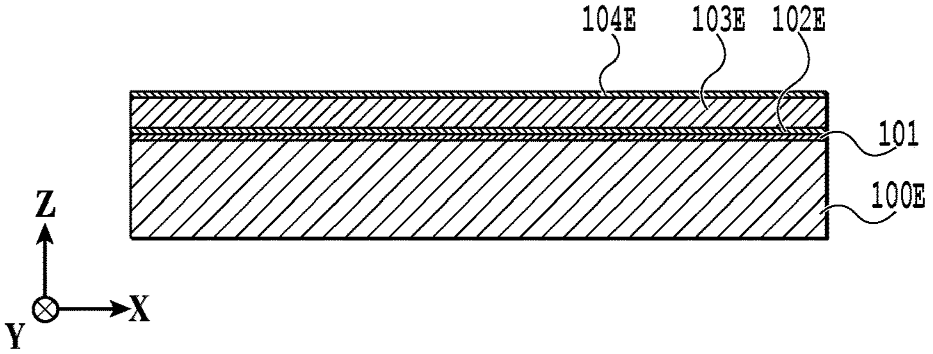

Next, as shown in FIG. 4B, on the insulating film 101, the first electrode layer 102E, the piezoelectric membrane layer 103E, and the second electrode layer 104E are formed in this order in the +Z-direction in an overlying manner. In the step of forming the first electrode layer 102E, the first electrode layer 102E is formed overlying the insulating film 101 by sputtering. In a case where the material for the piezoelectric membrane layer 103E is lead zirconate titanate, the material for the first electrode layer 102E functioning as a crystal orientation control film is preferably platinum, iridium, a platinum alloy, or an iridium alloy. As an adhesion layer for ensuring the strength of adhesion between the first electrode layer 102E and the insulating film 101, a thin film (not shown) of titanium, chromium, or the like may be formed between the first electrode layer 102E and the insulating film 101. In the step of forming the piezoelectric membrane layer 103E, the piezoelectric membrane layer 103E is formed overlying the first electrode layer 102E using a sol-gel process or the like, and the piezoelectric membrane layer 103E is fired to have a desired crystal orientation. In the step of forming the second electrode layer 104E, the second electrode layer 104E is formed overlying the piezoelectric membrane layer 103E by sputtering. A typical metal material can be used as a material for the second electrode layer 104E. Note that the material for the second electrode layer 104E is preferably platinum, titanium, tungsten, a platinum alloy, a titanium alloy, or a tungsten alloy.

Figure 4C:
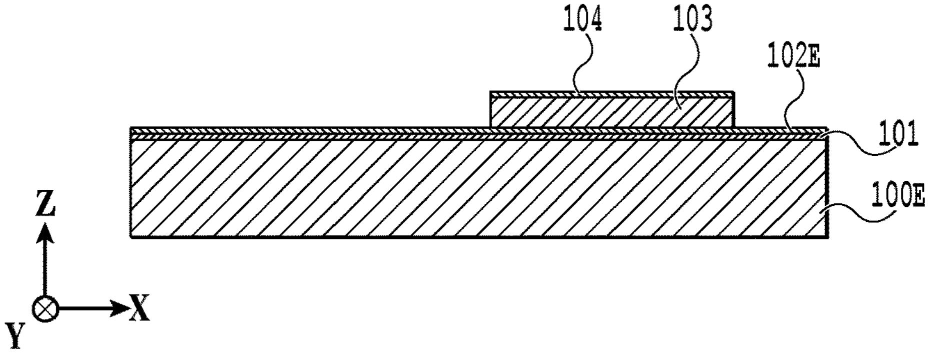

Next, as shown in FIG. 4C, the second electrode layer 104E and the piezoelectric membrane layer 103E are patterned to form the second electrodes 104 and the piezoelectric membranes 103. In the step of patterning the second electrode layer 104E and the piezoelectric membrane layer 103E, a desired resist pattern (not shown) is photolithographically formed on the second electrode layer 104E. After the resist pattern is formed, etching is performed to remove portions of the second electrode layer 104E and the piezoelectric membrane layer 103E that are not the portions to be the second electrode 104 and the piezoelectric membrane 103.

Figure 4D:
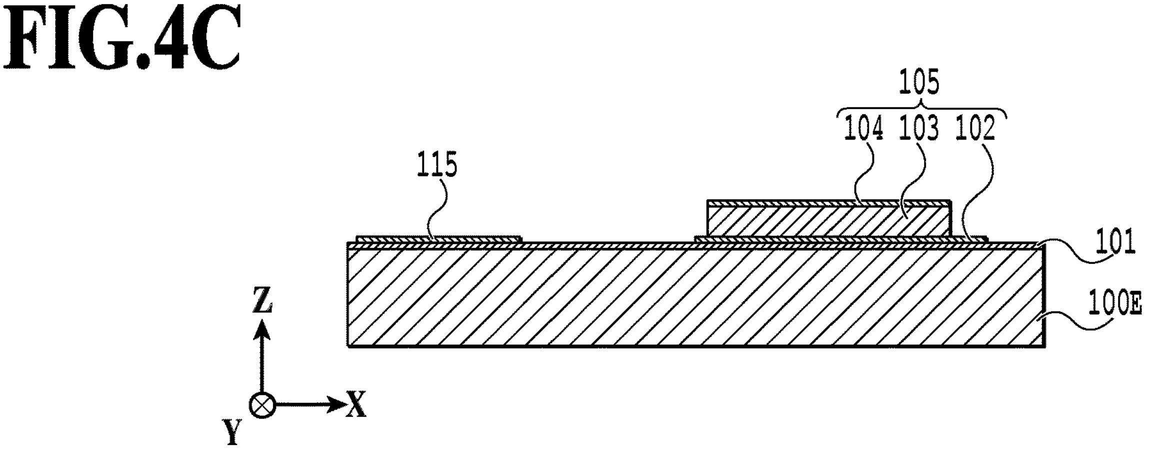

Next, as shown in FIG. 4D, the first electrode layer 102E is patterned to form the first electrodes 102 and the pad electrodes 115. In the step of patterning the first electrode layer 102E, another desired resist pattern (not shown) is photolithographically formed on the first electrode layer 102E. After the resist pattern is formed, etching is performed to remove portions of the first electrode layer 102E that are not the portions to be the first electrodes 102 and the pad electrodes 115. As a result of this etching, the piezoelectric elements 105 and the pad electrodes 115 are formed, the piezoelectric elements 105 each including the first electrode 102, the piezoelectric membrane 103, and the second electrode 104.

Figure 5A:
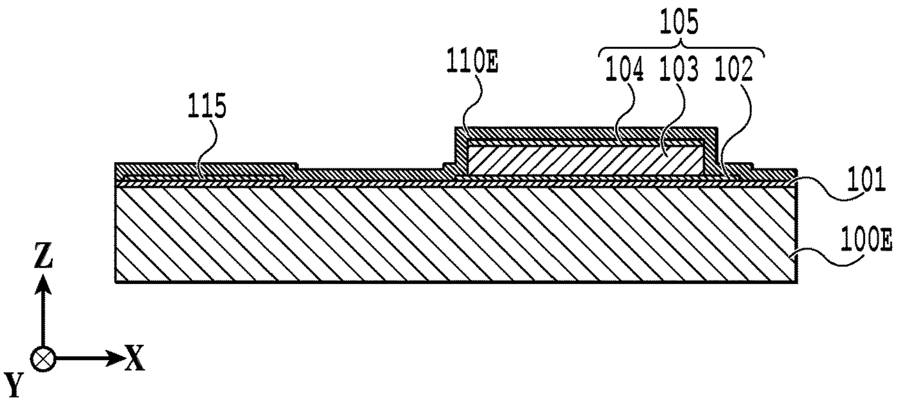
FIGS. 5A to 5D are step-by-step sectional views illustrating steps of manufacturing the liquid ejection head.

Next, as shown in FIG. 5A, the material film 110E is formed overlying the insulating film 101, the piezoelectric elements 105, and the pad electrodes 115. In the step of forming the material film 110E, the material film 110E is formed by chemical vapor deposition (CVD) or the like. As the material film 110E, a silicon oxide film, a silicon nitride film, a silicon oxynitride film, an aluminum oxide film, or the like is used.

Figure 5B:
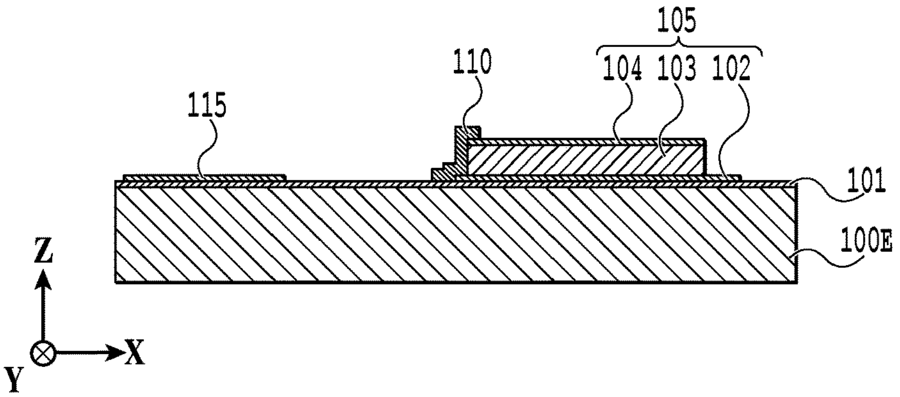

Next, as shown in FIG. 5B, the material film 110E is patterned to form the insulating layers 110. In the step of patterning the material film 110E, a desired resist pattern (not shown) is photolithographically formed on the material film 110E. After the resist pattern is formed, etching is performed to remove portions of the material film 110E other than portions to be the insulating layers 110.

Figure 5C:
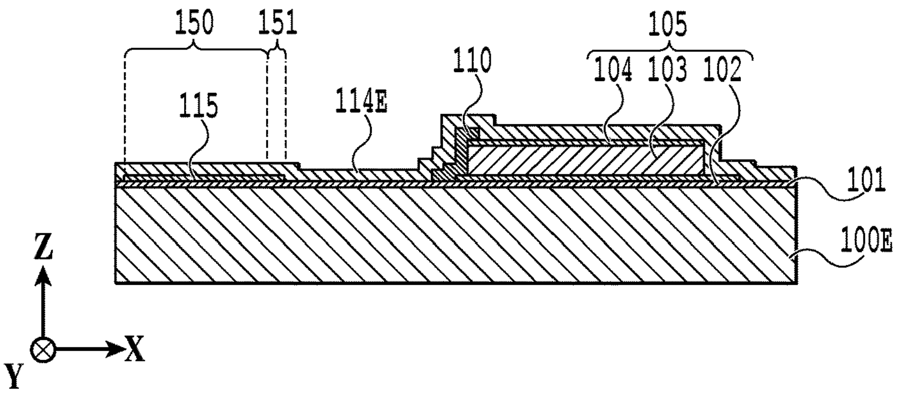

Next, as shown in FIG. 5C, the wiring layer 114E is formed overlying the insulating film 101, the piezoelectric elements 105, the pad electrodes 115, and the insulating layers 110. In the step of forming the wiring layer 114E, the wiring layer 114E is formed by sputtering. A material for the wiring layer 114E is preferably gold, aluminum, copper, a gold alloy, an aluminum alloy, or a copper alloy.

Figure 5D:
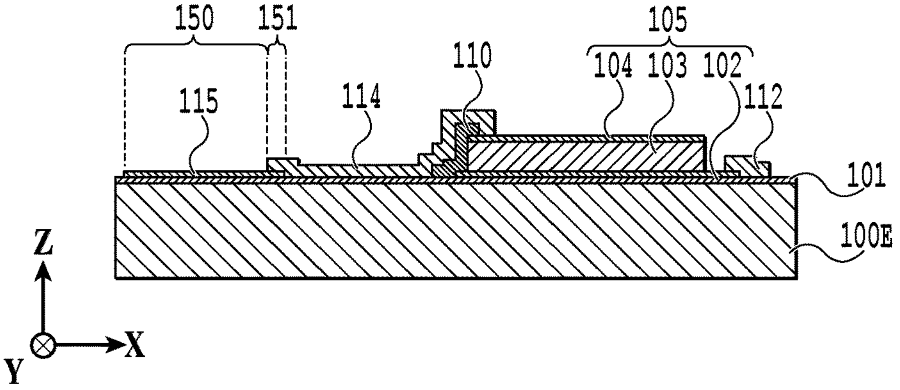

Next, as shown in FIG. 5D, the wiring layer 114E is patterned to form the first wirings 112 and the second wirings 114. In the step of forming the wiring layer 114E, a desired resist pattern (not shown) is photolithographically formed on the wiring layer 114E. After the resist pattern is formed, etching is performed to remove portions of the wiring layer 114E other than portions to be the first wirings 112 and the second wirings 114. After the etching is performed, portions of the wiring layer 114E that overlie the pad regions 150 of the pad electrodes 115 are removed, and an end portion of the first wiring 112 or the second wiring 114 is bonded to the connection region 151 of each pad electrode 115.

Figure 6A:
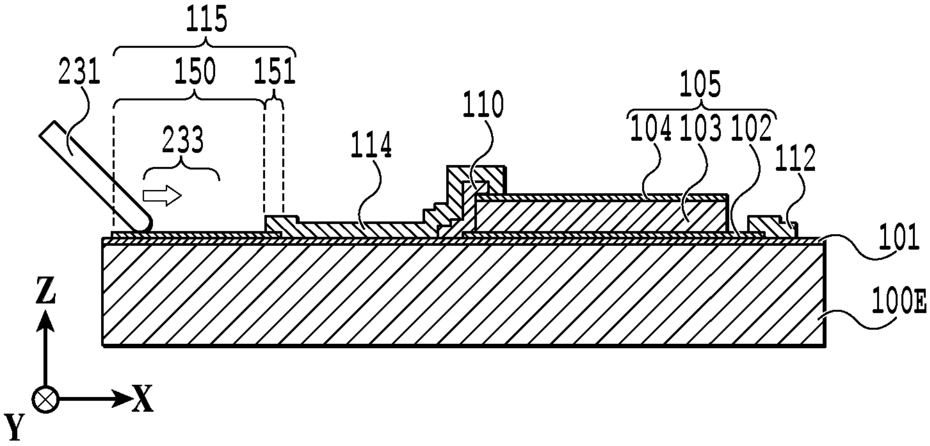
FIGS. 6A and 6B are step-by-step sectional views illustrating steps of manufacturing the liquid ejection head.

Next, as shown in FIG. 6A, electrical inspection is conducted. In the step of conducting electrical inspection, the probe 231 is brought into contact with the pad region 150 of each pad electrode 115 and scanned in the direction indicated by an arrow (the +X-direction in FIG. 6A). This electrically connects the probe 231 to the pad electrode 115. Here, the probing region 233 is set inside the pad region 150 of the pad electrode 115. The pad electrode 115 is formed from the same layer as the first electrode 102. Thus, a material for the pad electrode 115 is a hard metallic material with a Vickers hardness of 45 HV or greater, such as platinum or iridium. Thus, in the probing region 233, the pad electrode 115 is not scraped, and the probe mark 232 like the one shown in FIG. 11B and described earlier is not generated. With an electric signal given to the piezoelectric element 105 via the probe 231 in this state, electrical inspection, aging, screening, and the like are performed on the piezoelectric element 105.

Figure 6B:
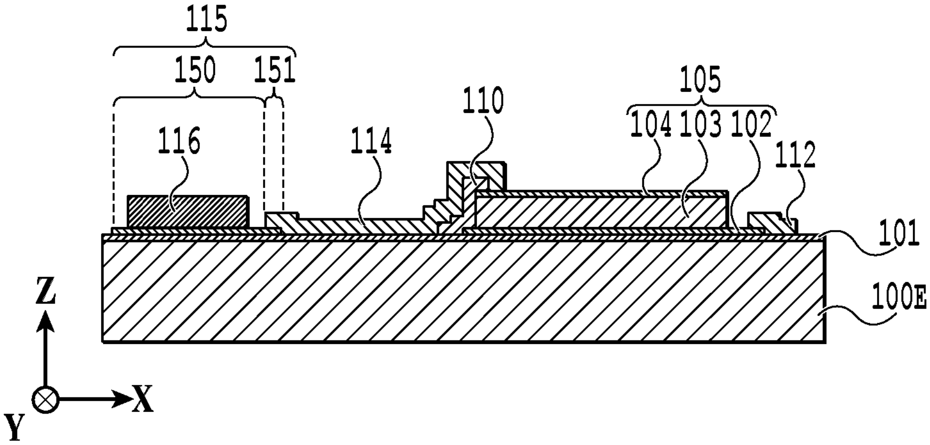

Next, as shown in FIG. 6B, the mounting electrodes 116 are formed on the pad regions 150 of the pad electrodes 115. A typically used metal material can be used as a material for the mounting electrodes 116. As described earlier, in a case where NCF/NCP is used as a method for mounting flexible boards, it is preferable that the mounting electrodes 116 be formed by gold plating or the like and bonded to the pad regions 150. In the step of forming the mounting electrodes 116, with a seed layer being a laminated film formed of a thin film of a titanium-tungsten alloy and a thin film of gold and formed by sputtering, a resist pattern is formed on unwanted regions, and a gold plating is applied. After the gold plating is applied, the resist on the unwanted regions and the seed layer are removed to form the mounting electrodes 116. Because the formation of the seed layer and the application of the gold plating are performed on the pad regions 150 of the flat pad electrodes 115 absent of probe marks, the mounting electrodes 116 formed are flat and uniform.

Although a detailed depiction is omitted, after the mounting electrodes 116 are formed, the substrate 100E is processed to form pressure chambers. After the step of forming the pressure chambers, a substrate as a raw material for the third flow channel substrate 40 is bonded to the upper surface side of the substrate 100E, and a substrate as a raw material for the first flow channel substrate 20 is bonded to the lower surface side of the substrate 100E. With this, a composite substrate where a plurality of chip-type liquid ejection heads (the element substrates 50) are formed is formed. After the step of bonding the substrates, the plurality of element substrates 50 formed at the composite substrate are divided and separated. After the step of dividing and separating the plurality of element substrates 50, flexible boards are mounted onto the mounting electrodes 116 using NCF/NCP. A liquid ejection head is thus completed by going through, after the formation of the mounting electrodes 116, steps such as the step of forming the pressure chambers, the step of bonding the substrates, the step of dividing and separating the plurality of element substrates 50, and the step of mounting the flexible boards.

In the present embodiment, using NCF/NCP, the flexible boards are mounted onto the flat, uniform mounting electrodes 116. This makes it possible to reduce a connection failure caused upon mounting of a flexible board and therefore manufacture a liquid ejection head with high electrical reliability in good yield. Also, the pad electrodes 115 each have the pad region 150 bonded to the mounting electrode 116 and the connection region 151 bonded to the first wiring 112 or the second wiring 114. Thus, even in a case where the piezoelectric elements 105 are disposed at high density, in the step of conducting electrical inspection, there is no need to provide an additional pad electrode for electrical inspection, the pad regions 150 of the pad electrodes 115 can also be used as the pad electrodes for electrical inspection.

As thus described, according to the liquid ejection head and the method of manufacturing the liquid ejection head of the present embodiment, a liquid ejection head with high electrical reliability can be provided. Specifically, in the present embodiment, the pad electrodes 115 are formed from the same layer as the first electrodes 102. Thus, a hard material with a relatively high electrical resistivity can be used as a material for the pad electrodes 115. Thus, electrical inspection, aging, screening, and the like can be performed on the piezoelectric elements 105 without generating probe marks on the pad electrodes 115. Then, after the step of conducting electrical inspection, the mounting electrodes 116 for external connection are formed on the pad regions 150 of the flat pad electrodes 115 absent of probe marks. The mounting electrodes 116 formed are therefore flat and uniform. In mounting of the flexible boards 160 onto the mounting electrodes 116, the electrodes 161 of the flexible boards 160 can be brought into contact with the flat, uniform mounting electrodes 116. This makes it difficult for the non-conductive adhesive 165 to enter between the mounting electrode 116 and the electrode 161 of the flexible board 160 and reduces a connection failure caused in mounting of the flexible board 160. In this way, a liquid ejection head with high electrical reliability can be provided.

Although NCF/NCP is used as a method for mounting the flexible boards 160 in the embodiment described above, the present disclosure is not limited to this. As a method for mounting the flexible boards 160, ACF/ACP may be used, or a mounting method using a wire bonder may be used.

Although the first wirings 112 are each a common wiring led from a plurality of piezoelectric elements 105 and the second wirings 114 are each an individual wiring led from an individual piezoelectric element 105 in the embodiment described above, the present disclosure is not limited to this. The first wiring 112 may be an individual wiring led from an individual piezoelectric element 105 and the second wiring 114 may be a common wiring led from a plurality of piezoelectric elements 105.

Although the pad electrodes 115 formed from the same layer as the first electrodes 102 are electrically connected to both of the first wirings 112 and the second wirings 114 in the present embodiment described above, the present disclosure is not limited to this. The pad electrodes 115 formed from the same layer as the first electrodes 102 may be electrically connected to either the first wirings 112 or the second wirings 114. For example, the pad electrodes 115 formed from the same layer as the first electrodes 102 may be electrically connected only to the second wirings 114. In this case, mounting electrodes may be bonded to the pad regions provided at the −X-direction-side end portions of the first wirings 112. Also, in this case, ACF/ACP may be used as a method for mounting flexible boards.

EXAMPLES

Next, specific examples of a liquid ejection head are described using the drawings.

Example 1

Figure 7A:
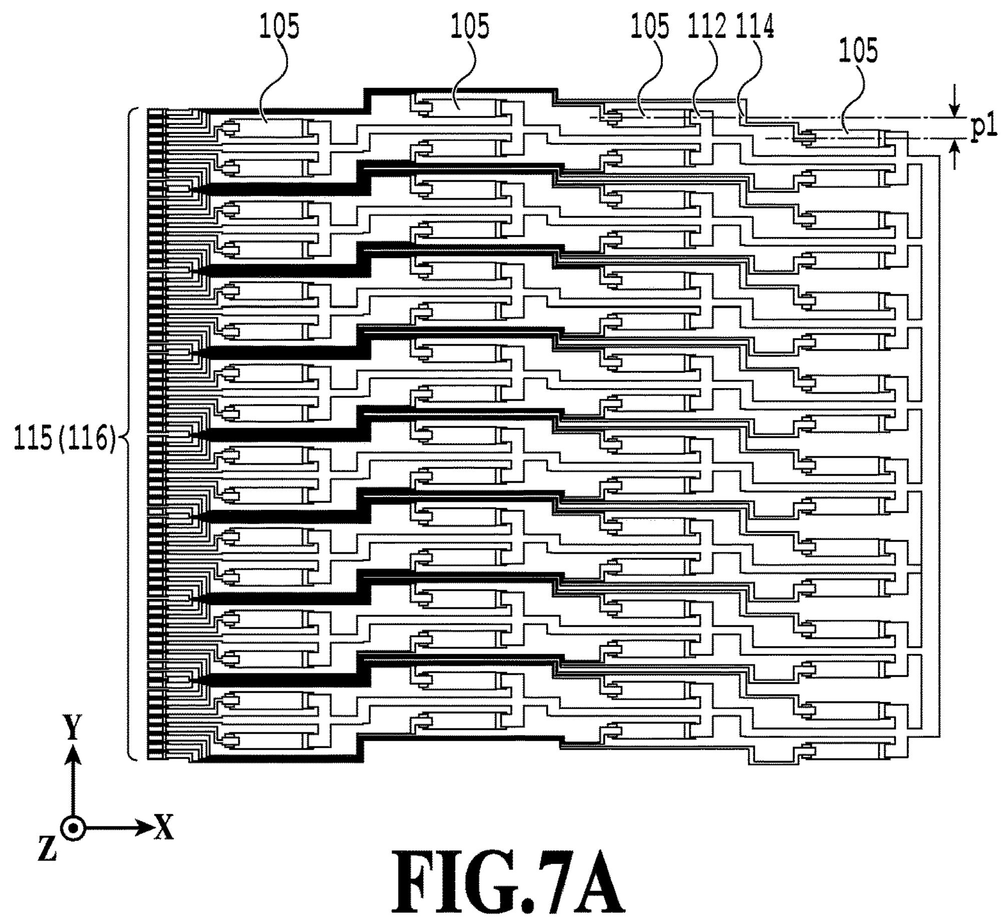
FIGS. 7A and 7B are plan views of a liquid ejection head.
Figure 7B:
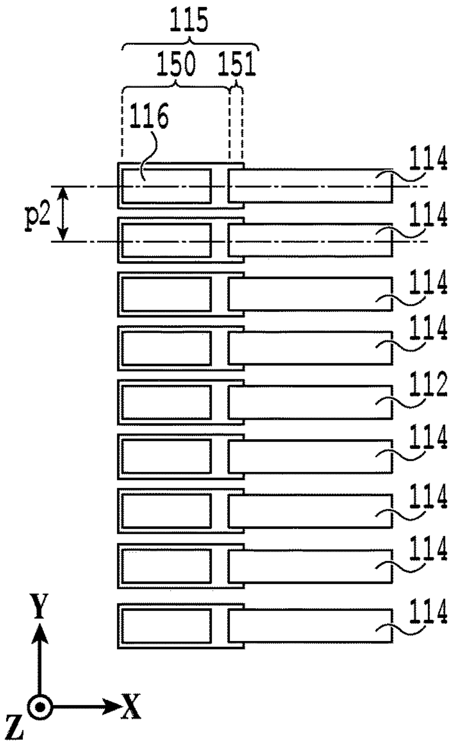

FIGS. 7A and 7B are plan views of Example 1 corresponding to the embodiment described above. FIG. 7A is an overall plan view of a liquid ejection head of Example 1. FIG. 7B is a close-up view of the pad electrodes 115 of Example 1. The members in Example 1 are configured similarly to those in the embodiment described above and are described using the same reference numerals as those of the members in the embodiment described above.

In Example 1, as shown in FIG. 7A, the piezoelectric elements 105 are arrayed in four arrays in a staggered arrangement at a density of 600 npi in the Y-direction. An array pitch p1 of the piezoelectric elements 105 in the Y-direction is approximately 42 μm. The size of the piezoelectric element 105 in the X-direction is approximately 700 μm, and the size of the piezoelectric element 105 in the Y-direction is approximately 50 μm. As to the first wirings 112 as common wirings, because of the wiring routing layout and the wiring resistance, a single first wiring 112 is disposed for eight piezoelectric elements 105. As shown in FIG. 7B, the pad electrodes 115 are arrayed only on one side (the −X-direction side) of the second flow channel substrate 100 (not shown in FIG. 7B). An array pitch p2 of the pad electrode 115 in the Y-direction is approximately 38 μm.

Also, a liquid ejection head of Example 1 is manufactured in a similar way to the method of manufacturing the liquid ejection head of the embodiment described above. In the step of forming the insulating film 101 (see FIG. 4A), the film thickness of the thermally oxidized silicon film is 500 nm.

In the step of forming the first electrode layer 102E (see FIG. 4B), platinum is used as a material for the first electrode layer 102E (i.e., the first electrodes 102 and the pad electrodes 115), and the thickness of the first electrode layer 102E is 100 nm. Also, as an adhesion layer for ensuring the strength of adhesion between the first electrode layer 102E and the insulating film 101, a thin film of titanium (not shown) with a thickness of 10 nm is formed by sputtering. In the step of forming the piezoelectric membrane layer 103E (see FIG. 4B), lead zirconate titanate is used as a material for the piezoelectric membrane layer 103E (i.e., the piezoelectric membranes 103), and the thickness of the piezoelectric membrane layer 103E is 2 μm. In the step of forming the second electrode layer 104E (see FIG. 4B), a titanium-tungsten alloy is used as a material for the second electrode layer 104E (i.e., the second electrode 104), and the thickness of the second electrode layer 104E is 100 μm.

In the step of forming the material film 110E (see FIG. 5A), a silicon oxide film is used as the material film 110E, and the thickness of the material film 110E (i.e., the insulating layers 110) is 400 nm. In the step of forming the wiring layer 114E (see FIG. 5C), an aluminum alloy is used as a material for the wiring layer 114E (i.e., the first wirings 112 and the second wirings 114), and the thickness of the wiring layer 114E is 600 nm.

As a result of this, in the step of conducting electrical inspection (see FIG. 6A), electrical inspection can be conducted without scraping the pad electrode 115. In the step of forming the mounting electrodes 116 (see FIG. 6B), the mounting electrodes 116 are formed by gold plating or the like, and the thickness of the mounting electrodes 116 is 5 μm. In this event, a seed layer is formed and a gold plating is applied onto the pad regions 150 of the flat pad electrodes 115 absent of probe marks, and therefore, the mounting electrodes 116 formed can be flat and uniform.

Then, in the step of mounting the flexible boards, the flexible boards can be mounted onto the flat and uniform mounting electrodes 116 using NCF/NCP. This makes it possible to reduce a connection failure caused in mounting of the flexible boards and therefore manufacture a liquid ejection head with high electrical reliability in good yield.

As thus described, according to Example 1, a liquid ejection head with high electrical reliability can be provided.

Example 2

Figure 8:
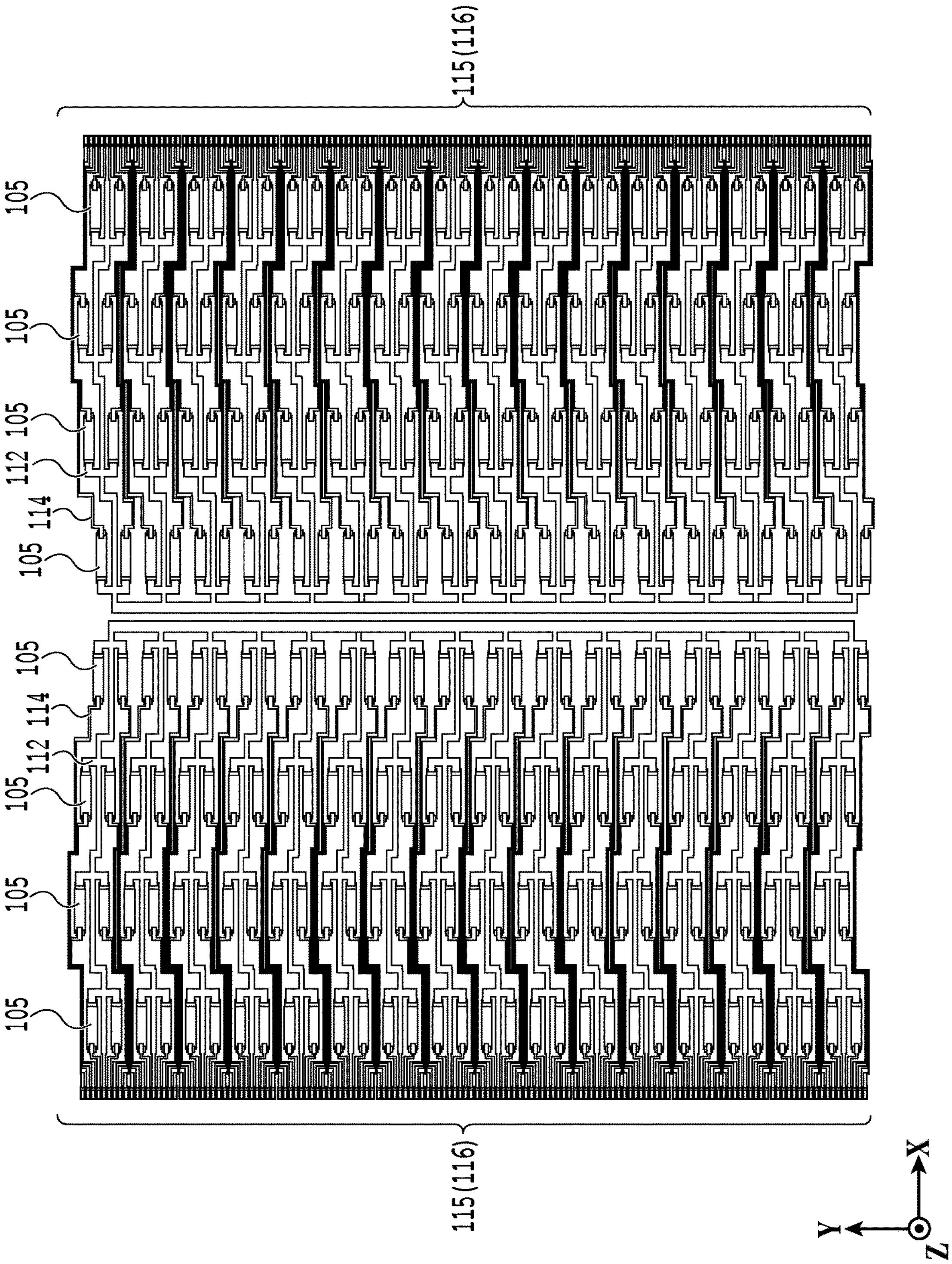
FIG. 8 is a plan view of a liquid ejection head.

FIG. 8 is a plan view of Example 2 corresponding to the embodiment described above. The members in Example 2 are configured similarly to those in Example 1, and therefore only portions different from Example 1 are described.

In Example 2, as shown in FIG. 8, the piezoelectric elements 105 are arrayed in eight arrays in a staggered arrangement at a density of 1200 npi in the Y-direction. The array pitch of the piezoelectric elements 105 in the Y-direction is approximately 21 μm. The pad electrodes 115 are divided and arrayed on both sides (the −X-direction side and the +X-direction side) of the second flow channel substrate 100 (not shown in FIG. 8). On each of the sides, the array pitch of the pad electrodes 115 in the Y-direction is approximately 38 μm, as is similar to Example 1.

According to Example 2, like Example 1, a light ejection head with high electrical reliability can be provided.

Example 3

Figure 9A:
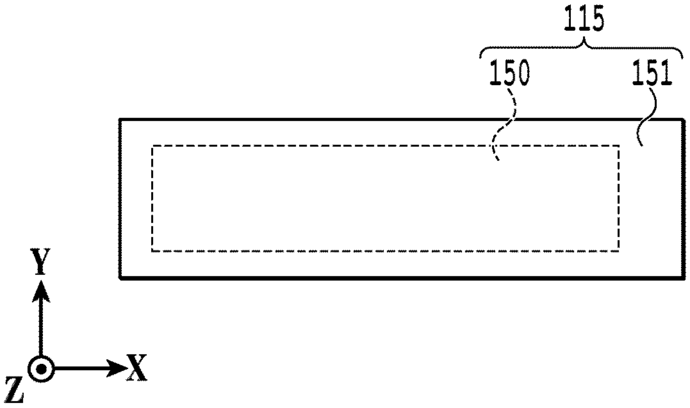
FIGS. 9A to 9C are plan views of a pad electrode.
Figure 9B:
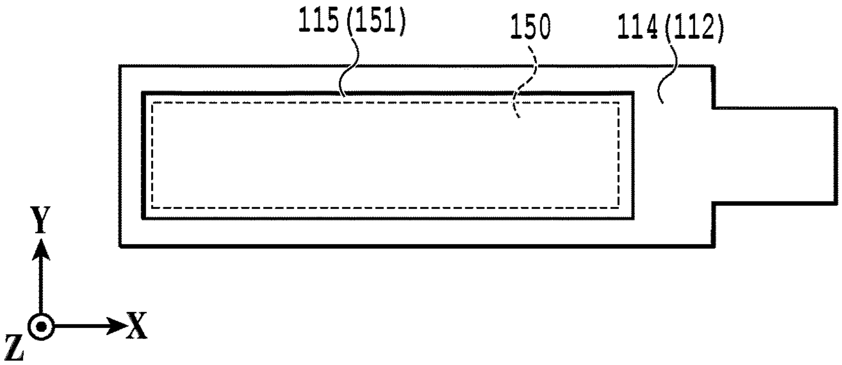
Figure 9C:
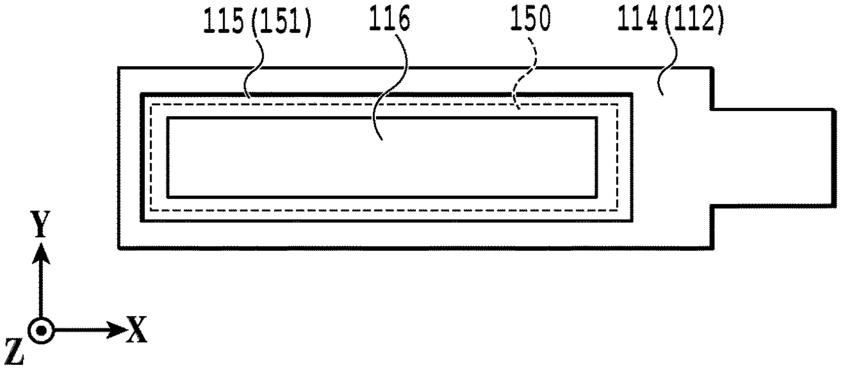

FIGS. 9A to 9C are plan views showing the pad electrode 115 of Example 3 corresponding to the embodiment described above. FIG. 9A is a plan view showing the pad region 150 and the connection region 151 of the pad electrode 115 of Example 3. FIG. 9B is a plan view showing a state where the second wiring 114 (or the first wiring 112) is bonded to the connection region 151 of the pad electrode 115 of Embodiment 3. FIG. 9C is a plan view showing a state where the mounting electrode 116 is bonded to the pad region 150 of the pad electrode 115 of Example 3. The members in Example 3 are configured similarly to those in Example 1, and therefore only portions different from Example 1 are described.

In Example 3, as shown in FIG. 9A, the pad region 150 is a region in the center part of the pad electrode 115, which is surrounded by a broken line. The connection region 151 is a region outside of the pad electrode 115, surrounding the periphery of the pad region 150. Then, as shown in FIG. 9B, an end portion of the second wiring 114 (or the first wiring 112) is formed at the connection region 151 of the pad electrode 115, in such a manner as to surround the pad region 150. Note that in the step of forming the first wirings 112 and the second wirings 114 (see FIG. 5D), the etching removes portions of the wiring layer 114E that overlie the center-side pad regions 150 of the pad electrodes 115.

Also, in the step of conducting electrical inspection (see FIG. 6A), the probe is brought into contact with the pad regions 150 surrounded by the second wirings 114 (or the first wirings 112) and scanned in the X-direction. This example also makes it possible to conduct electrical inspection without scraping the pad electrodes 115, like in Example 1. After the step of conducting electrical inspection, as shown in FIG. 9C, the mounting electrodes 116 are formed at the pad regions 150 surrounded by the second wirings 114 (or the first wirings 112). This example also can form flat uniform mounting electrodes 116, like Example 1.

According to Example 3, like Example 1, a liquid ejection head with high electrical resistance can be provided.

Also, according to Example 3, the second wirings 114 (or the first wirings 112) are formed in such a manner as to surround the pad regions 150. Thus, slight misalignment does not hinder the pad electrode 115 from being electrically connected to the second wiring 114 (or the first wiring 112). Also, because the area of connection between the flexible board and the electrode is increased without changing the connection pitch, the pad electrodes 115 needs to be formed to be elongated in the X-direction. In this case, because the second wiring 114 (or the first wiring 112) with a lower electrical resistivity than the pad electrode 115 is formed in such a manner as to surround the pad region 150, there is also an advantageous effect of reducing the electrical resistance of the pad electrode 115 during the conduction of electrical inspection.

Example 4

Figure 10:
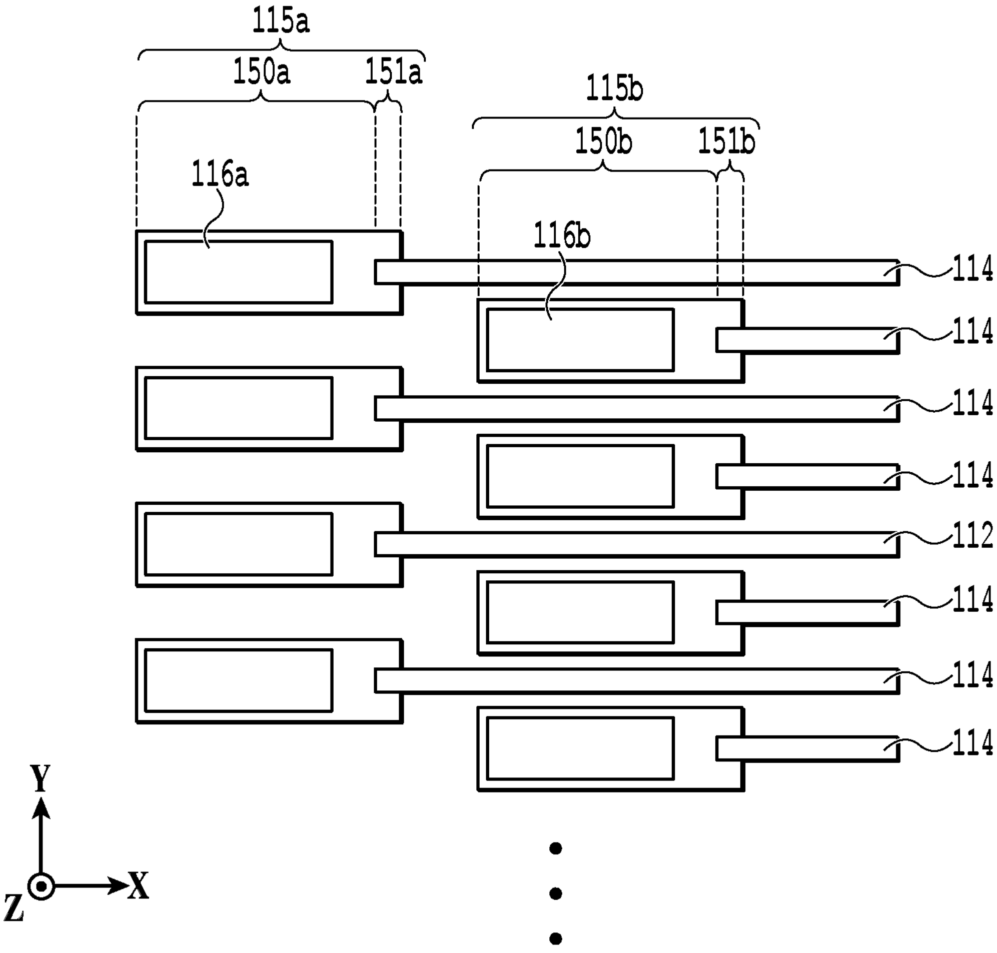
FIG. 10 is a plan view of pad electrodes.

FIG. 10 is a plan view showing pad electrodes 115*a*, 115*b* of Example 4 corresponding to the embodiment described above. The members in Example 4 are configured similarly to those in Example 1, and therefore only portions different from Example 1 are described.

In Example 4, as shown in FIG. 10, a plurality of sets of two arrays of the pad electrodes 115*a*, 115*b* that are staggered in the X-direction are arrayed in the Y-direction. The two arrays of the pad electrodes 115*a*, 115*b* are formed similarly to the pad electrodes 115 of the embodiment described above. A mounting electrode 116*a* is bonded to a pad region 150*a* of the pad electrode 115*a* located on the −X-direction side. The first wiring 112 or the second wiring 114 is bonded to a connection region 151*a* of the pad electrode 115*a* located on the −X-direction side. A mounting electrode 116*b* is bonded to a pad region 150*b* of the pad electrode 115*b* located on the +X-direction side. The first wiring 112 or the second wiring 114 is bonded to a connection region 151*b* of the pad electrode 115*b* located on the +X-direction side. In this way, a plurality of sets of two arrays of mounting electrodes 116*a*, 116*b* staggered in the X-direction are arrayed in the Y-direction. Also, the two lines of mounting electrodes 116*a*, 116*b* are formed similarly to the mounting electrodes 116 of the embodiment described above.

According to Example 4, like Example 1, a liquid ejection head with high electrical reliability can be provided.

Also, according to Example 4, because of the staggered arrangement of the pad electrodes 115*a*, 115*b*, the pad electrodes 115*a*, 115*b* can be arranged in the Y-direction at an even higher density without changing the size of the pad electrodes 115*a*, 115*b*. Note that in a case where the pad electrodes 115*a*, 115*b* are arranged in a staggered arrangement, for example, bumps need to be formed at wirings for the flexible boards, in correspondence to the arrangement of the mounting electrodes 116*a*, 116*b*. Also, due to the low rigidity of the flexible boards, a connection failure may occur. For these reasons, for example, a silicon board with high rigidity or an interposer substrate having wirings formed on a glass substrate may be used instead of the flexible board.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2023-200660, filed Nov. 28, 2023, which is hereby incorporated by reference wherein in its entirety.

What is claimed is:

1. A liquid ejection head comprising:
an ejection element substrate having
a substrate where a pressure chamber is formed, the pressure chamber communicating with an ejection port from which a droplet is ejected,
a vibration plate provided on one surface side of the substrate,
a piezoelectric element having a first electrode, a piezoelectric layer, and a second electrode in this order on a surface of the vibration plate opposite from the substrate,
a first wiring electrically connected to the first electrode,
a second wiring electrically connected to the second electrode, and
a pad electrode electrically connected to at least one of the first wiring and the second wiring, the pad electrode including a layer formed of a same material as the first electrode; and
an electric wiring board electrically connected to the pad electrode with a mounting electrode interposed in between, wherein
the pad electrode has a higher hardness than the first wiring and the second wiring, and
the pad electrode has
a pad region to which the mounting electrode is bonded and
a connection region to which the wiring electrically connected to the pad electrode is bonded.

2. The liquid ejection head according to claim 1, wherein the pad electrode is formed of platinum, iridium, a platinum alloy, or an iridium alloy.

3. The liquid ejection head according to claim 1, wherein a Vickers hardness of the pad electrode is 45 HV or greater.

4. The liquid ejection head according to claim 1, wherein the wiring electrically connected to the pad electrode is formed of gold, aluminum, copper, a gold alloy, an aluminum alloy, or a copper alloy.

5. The liquid ejection head according to claim 1, further comprising
a plurality of pad electrodes,
wherein the plurality of pad electrodes includes the pad electrode,
wherein the pad electrodes of the plurality of pad electrodes are arrayed side by side, and
wherein a ratio of a length of the connection region to a length of each pad electrode of the plurality of pad electrodes in a direction intersecting with a direction in which the pad electrodes of the plurality of pad electrodes are arrayed is 0.2 or below.

6. The liquid ejection head according to claim 1, further comprising
a plurality of pad electrodes,
wherein the plurality of pad electrodes includes the pad electrode,
wherein the pad electrodes of the plurality of pad electrodes are arrayed side by side, and
wherein a ratio of a length of the mounting electrode to a length of each pad electrode of the plurality of pad electrodes in a direction intersecting with a direction in which the pad electrodes of the plurality of pad electrodes are arrayed is 0.5 or greater.

7. The liquid ejection head according to claim 1, further comprising
a plurality of pad electrodes,
wherein the plurality of pad electrodes includes the pad electrode,
wherein the pad electrodes of the plurality of pad electrodes are arrayed side by side, and
wherein an array pitch of the pad electrodes of the plurality of pad electrodes is 50 μm or below.

8. The liquid ejection head according to claim 1, further comprising
a plurality of pad electrodes,
wherein the plurality of pad electrodes includes the pad electrode,
wherein the pad electrodes of the plurality of pad electrodes are arrayed side by side along a periphery portion on one side of the substrate.

9. The liquid ejection head according to claim 1, wherein
the ejection element substrate has a plurality of piezoelectric elements,
the plurality of piezoelectric elements includes the piezoelectric element,
the substrate has a plurality of ejection ports and a plurality of pressure chambers in correspondence to the plurality of piezoelectric elements,
the plurality of ejection ports include the ejection port and the plurality of pressure chambers include the pressure chamber,
the first wiring is a common wiring which is common to multiple piezoelectric elements of the plurality of piezoelectric elements, and
the second wiring is an individual wiring used for an individual piezoelectric element of the plurality of piezoelectric elements.

10. The liquid ejection head according to claim 1, wherein
the mounting electrode is formed of a material different from a material for the wiring electrically connected to the pad electrode.

11. The liquid ejection head according to claim 1, wherein
the mounting electrode is formed of at least one of gold, aluminum, copper, a gold alloy, an aluminum alloy, or a copper alloy.

12. The liquid ejection head according to claim 1, wherein
the electric wiring board is a flexible board.

13. The liquid ejection head according to claim 12, wherein
the flexible board is bonded to the ejection element substrate using an anisotropic conductive film, an anisotropic conductive paste, a non-conductive film, or a non-conductive paste.

14. The liquid ejection head according to claim 1, wherein
the electric wiring board is electrically connected to the pad electrode in such a manner that the electric wiring board faces the pad electrode.

15. A liquid ejection head comprising:
an ejection element substrate having
a substrate where a pressure chamber is formed, the pressure chamber communicating with an ejection port from which a droplet is ejected,
a vibration plate provided on one surface side of the substrate,
a piezoelectric element having a first electrode, a piezoelectric layer, and a second electrode in this order on a surface of the vibration plate opposite from the substrate,
a first wiring electrically connected to the first electrode,
a second wiring electrically connected to the second electrode, and
a pad electrode electrically connected to at least one of the first wiring and the second wiring; and
an electric wiring board electrically connected to the pad electrode with a mounting electrode interposed in between, wherein
the pad electrode has a higher hardness than the first wiring and the second wiring,
the pad electrode has
a pad region to which the mounting electrode is bonded and
a connection region to which the wiring electrically connected to the pad electrode is bonded,
the first electrode is formed of platinum, iridium, a platinum alloy, or an iridium alloy, and
the pad electrode is formed of platinum, iridium, a platinum alloy, or an iridium alloy.

16. A method of manufacturing a liquid ejection head having a piezoelectric element having a first electrode, a piezoelectric layer, and a second electrode in this order, the method comprising:
forming a first layer on a substrate;
forming the piezoelectric layer and the second electrode on the first layer;
patterning the first layer to form the first electrode overlain by the piezoelectric layer and a pad electrode to be electrically connected to an electric wiring board;
forming a second layer overlying the pad electrode and the second electrode;
patterning the second layer to form an wiring electrically connecting the pad electrode and the piezoelectric element to each other; and
electrically connecting the electric wiring board to the pad electrode with a mounting electrode interposed in between, wherein
the pad electrode has a pad region to which the mounting electrode is bonded and a connection region which is different from the pad region and to which the wiring is connected, and
in the patterning the second layer, the wiring is connected to the connection region.

17. The method of manufacturing a liquid ejection head according to claim 16, wherein
in the forming a second layer, the second layer with a hardness lower than the first layer is formed.

18. The method of manufacturing a liquid ejection head according to claim 16, wherein
in the patterning the second layer, a portion of the second layer is removed, the portion overlying the pad region of the pad electrode.

19. The method of manufacturing a liquid ejection head according to claim 16, further comprising:
after the formation of the wiring, conducting electrical inspection by bringing a probe into contact with the pad region; and
after the conducting electrical inspection, bonding the mounting electrode to the pad region.

20. The method of manufacturing a liquid ejection head according to claim 16, further comprising electrically connecting the electric wiring board to the pad electrode in such a manner that the electric wiring board faces the pad electrode.

* * * * *